(12) United States Patent
Akel et al.

(10) Patent No.: US 12,640,730 B2
(45) Date of Patent: May 26, 2026

(54) CIRCUITS AND METHODS FOR GATE OVERDRIVE IN GaN POWER STAGES

(71) Applicant: Navitas Semiconductor Limited, Dublin (IE)

(72) Inventors: Nabil Akel, Long Beach, CA (US); Jason Zhang, Monterey Park, CA (US); Victor Sinow, Fresno, CA (US); Thomas Ribarich, Laguna Beach, CA (US)

(73) Assignee: Navitas Semiconductor Limited, Dublin (IE)

( * ) Notice: Subject to any disclaimer, the term of this patent is extended or adjusted under 35 U.S.C. 154(b) by 178 days.

(21) Appl. No.: 18/733,480

(22) Filed: Jun. 4, 2024

(65) Prior Publication Data

US 2024/0405764 A1 Dec. 5, 2024

Related U.S. Application Data

(60) Provisional application No. 63/506,334, filed on Jun. 5, 2023.

(51) Int. Cl.
*H03K 17/10* (2006.01)
*H02M 1/08* (2006.01)
*H03K 17/081* (2006.01)

(52) U.S. Cl.
CPC ............ *H03K 17/102* (2013.01); *H02M 1/08* (2013.01); *H03K 17/08104* (2013.01)

(58) Field of Classification Search
None
See application file for complete search history.

(56) References Cited

U.S. PATENT DOCUMENTS

| | | | |
|---|---|---|---|
| 11,082,039 B2 * | 8/2021 | Chen | H10D 64/411 |
| 11,736,100 B2 * | 8/2023 | Hou | H03K 17/08122 |
| | | | 361/93.1 |
| 12,046,667 B2 * | 7/2024 | Udrea | H10D 84/84 |
| 12,119,739 B2 * | 10/2024 | Giandalia | H02M 1/08 |
| 12,126,267 B2 * | 10/2024 | Lee | H02M 3/01 |
| 12,132,470 B2 * | 10/2024 | Sarkar | H03K 17/08122 |
| 2023/0013041 A1 * | 1/2023 | Takimoto | H03K 17/04123 |
| 2023/0336173 A1 * | 10/2023 | Isobe | H03K 17/0822 |
| 2024/0313756 A1 * | 9/2024 | Zhang | H02J 7/342 |

* cited by examiner

*Primary Examiner* — Cassandra F Cox
(74) *Attorney, Agent, or Firm* — FisherBroyles, LLP

(57) ABSTRACT

A circuit is disclosed. The circuit includes a gallium nitride (GaN) switch having a gate terminal, a drain terminal and a source terminal, a driver circuit having an output terminal coupled to the gate terminal, where the driver circuit is arranged to generate an output voltage at the output terminal such that: the output voltage is at a first voltage when a voltage at the drain terminal is below a predetermined voltage; the output voltage is at a second voltage when 1) the voltage at the drain terminal is above the predetermined voltage and 2) a time period during which the output voltage is at the second voltage is less than a predetermined time. In one aspect, the second voltage is greater than the first voltage.

20 Claims, 7 Drawing Sheets

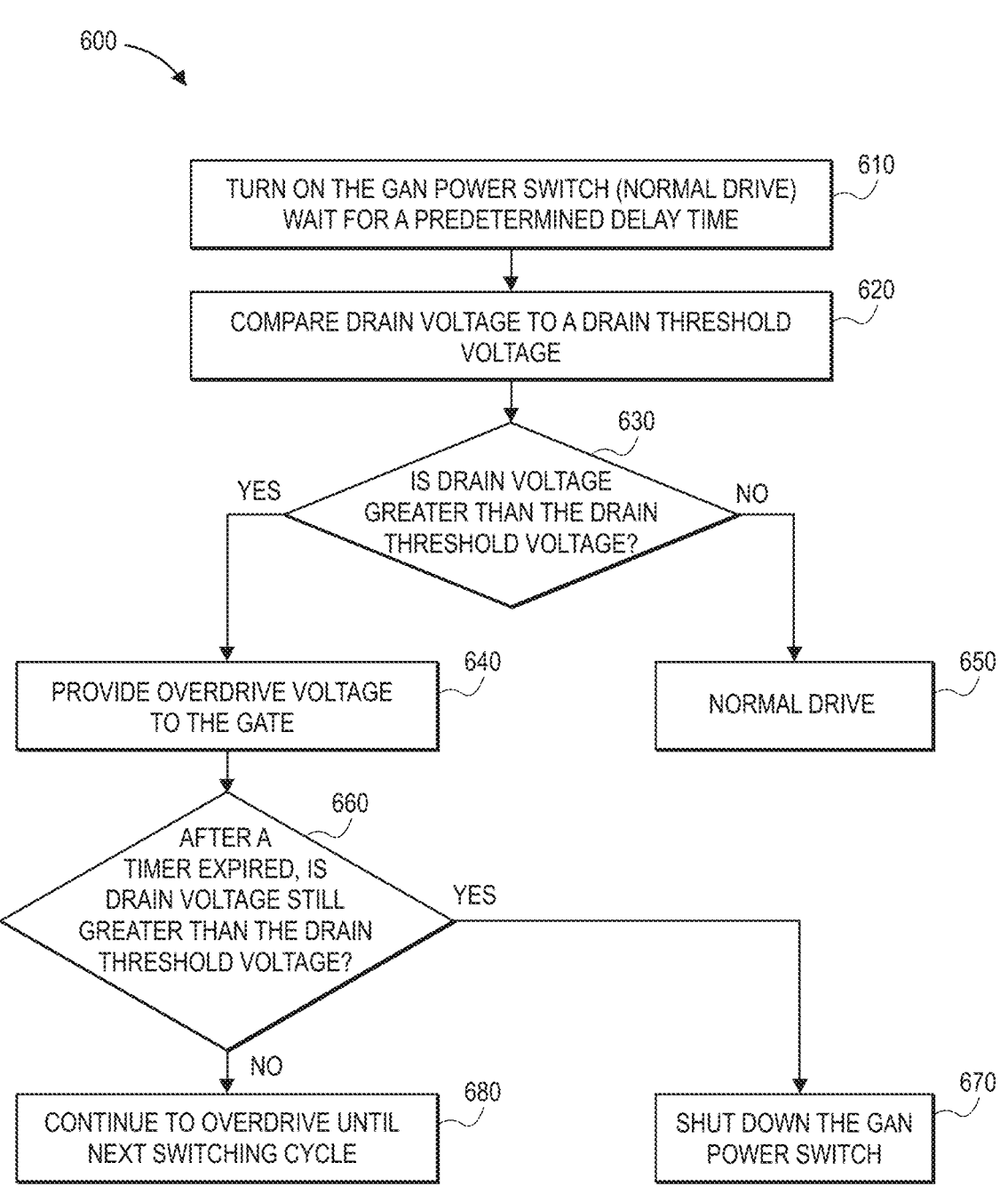

600

TURN ON THE GAN POWER SWITCH (NORMAL DRIVE) WAIT FOR A PREDETERMINED DELAY TIME — 610

COMPARE DRAIN VOLTAGE TO A DRAIN THRESHOLD VOLTAGE — 620

630
IS DRAIN VOLTAGE GREATER THAN THE DRAIN THRESHOLD VOLTAGE?

YES

NO

PROVIDE OVERDRIVE VOLTAGE TO THE GATE — 640

NORMAL DRIVE — 650

660
AFTER A TIMER EXPIRED, IS DRAIN VOLTAGE STILL GREATER THAN THE DRAIN THRESHOLD VOLTAGE?

YES

NO

CONTINUE TO OVERDRIVE UNTIL NEXT SWITCHING CYCLE — 680

SHUT DOWN THE GAN POWER SWITCH — 670

FIG. 6

CIRCUITS AND METHODS FOR GATE OVERDRIVE IN GaN POWER STAGES

CROSS REFERENCE TO RELATED APPLICATIONS

This application claims priority to U.S. provisional patent application No. 63/506,334, for "CIRCUITS AND METHODS FOR GATE OVERDRIVE IN GAN POWER STAGES" filed on Jun. 5, 2023, which is hereby incorporated by reference in entirety for all purposes.

FIELD

The described embodiments relate generally to power converters, and more particularly, the present embodiments relate to circuits and methods for gate overdrive in gallium nitride (GaN) power stages that are used in power converters.

BACKGROUND

Electronic devices such as computers, servers and televisions, among others, employ one or more electrical power conversion circuits to convert one form of electrical energy to another. Some electrical power conversion circuits convert a high (or low) DC voltage to a lower (or higher) DC voltage using a circuit topology called DC-DC converter. As many electronic devices are sensitive to size and efficiency of the power conversion circuit, new power converters can provide relatively higher efficiency and lower size for the new electronic devices.

SUMMARY

In some embodiments, a circuit is disclosed. The circuit includes a gallium nitride (GaN) switch having a gate terminal, a drain terminal and a source terminal; and a driver circuit having an output terminal coupled to the gate terminal, where the driver circuit is arranged to generate an output voltage at the output terminal such that: the output voltage is set to a first voltage when a voltage at the drain terminal is below a predetermined voltage; the output voltage is set to a second voltage when the voltage at the drain terminal is above the predetermined voltage; and where the second voltage is greater than the first voltage.

In some embodiments, the driver circuit is further arranged to generate the output voltage at the output terminal such that the output voltage is at the second voltage a for a predetermined time.

In some embodiments, when the voltage at the drain terminal is above the predetermined voltage after the predetermined time, the driver circuit generates zero voltage at the output terminal.

In some embodiments, the predetermined time is fixed.

In some embodiments, the driver circuit includes a first detector circuit arranged to detect a voltage at the drain terminal.

In some embodiments, the driver circuit further includes a second detector circuit arranged to detect a gate terminal voltage.

In some embodiments, the predetermined voltage is a first predetermined voltage, and wherein the driver circuit further comprises a comparator arranged to compare the detected gate terminal voltage to a second predetermined voltage.

In some embodiments, a circuit is disclosed. The circuit includes a gallium nitride (GaN) switch having a gate terminal, a drain terminal and a source terminal; a driver circuit having an output terminal coupled to the gate terminal, where the driver circuit is arranged to generate an output voltage at the output terminal such that: the output voltage is at a first voltage when a voltage at the drain terminal is below a predetermined voltage; the output voltage is at a second voltage when 1) the voltage at the drain terminal is above the predetermined voltage and 2) a time period during which the output voltage is at the second voltage is less than a predetermined time; and where the second voltage is greater than the first voltage.

In some embodiments, the predetermined time is 200 nano seconds.

In some embodiments, a system is disclosed. The system includes a gallium nitride (GaN) switch having a gate terminal, a drain terminal and a source terminal; a driver circuit coupled to the gate terminal and arranged to generate an output voltage at the gate terminal to control a conductivity state of the GaN switch; a first detector device coupled to the GaN switch and arranged to detect a drain terminal current and generate a first signal such that when the drain terminal current is less than a first predetermined current the first signal has a low state and when the drain terminal current is greater than the first predetermined current the first signal has a high state; and wherein the output voltage is set to a first voltage when the first signal has a low state and is set to a second voltage when the first signal has a high state.

In some embodiments, the system further includes a controller arranged to receive the first signal and in response transmit a second signal to the driver circuit.

In some embodiments, the system further includes a second detector coupled to the gate terminal and arranged to detect a gate terminal voltage.

In some embodiments of the system, the second detector is arranged to generate a third signal such that when the gate terminal voltage is less than a second predetermined voltage the third signal has a low state and when the gate terminal voltage is greater than the second predetermined voltage the third signal has a high state.

In some embodiments of the system, the controller is arranged to receive the third signal and in response to receiving the third signal transmit a fourth signal to the driver circuit.

In some embodiments of the system, the driver circuit is arranged to receive the second and fourth signals and in response to receiving the second and fourth signals, generate the output voltage such that the GaN switch operates in its safe operating area (SOA).

BRIEF DESCRIPTION OF THE DRAWINGS

FIG. 6 is a simplified flowchart illustrating a method of overdriving a gate of GaN power switch according to embodiments of the disclosure.

DETAILED DESCRIPTION

Figure 1:
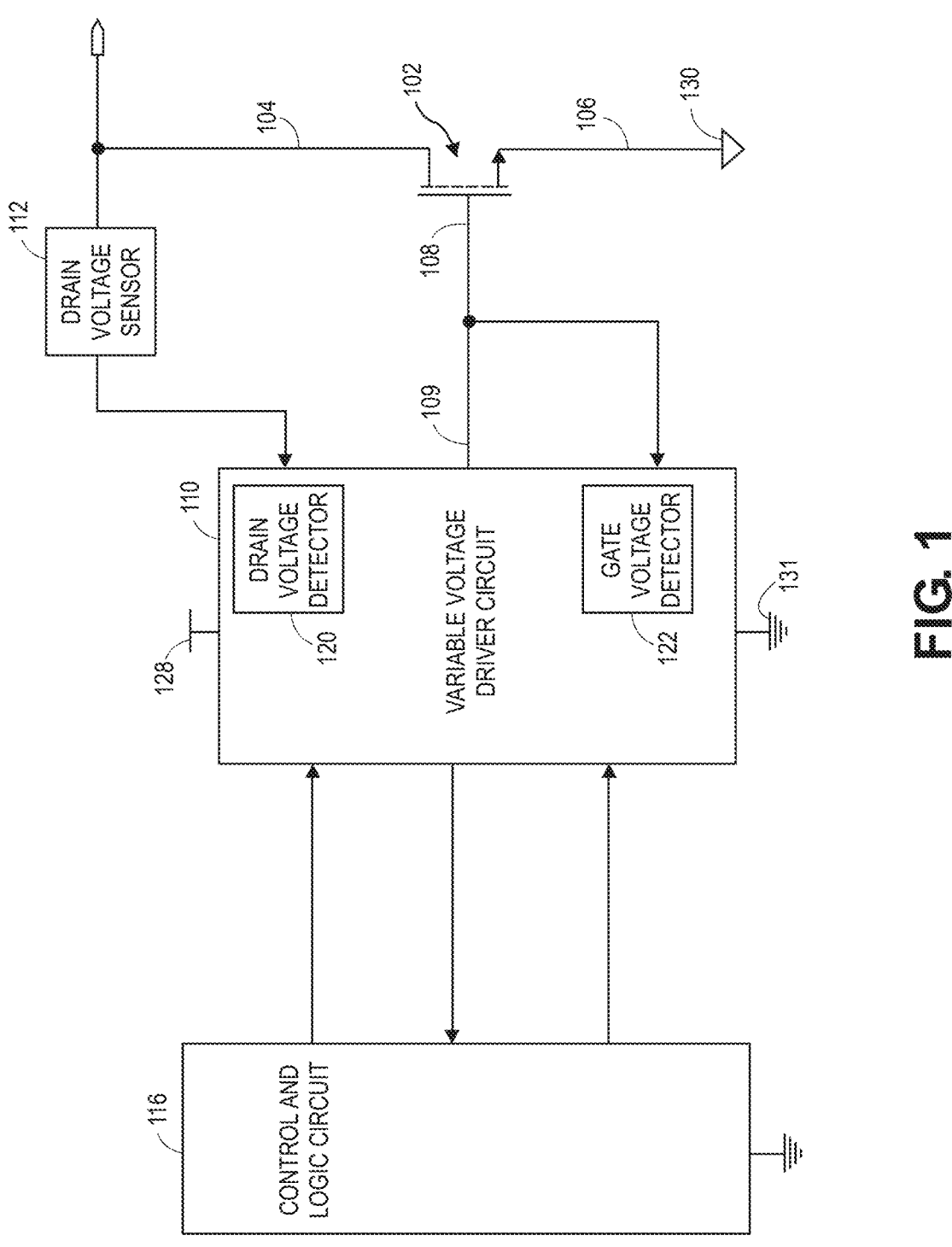
FIG. 1 illustrates a variable voltage driver circuit, according to certain embodiments.

Circuits, devices and related techniques disclosed herein relate generally to power converters. More specifically, circuits, devices and related techniques disclosed herein relate to circuits and methods for gate overdrive in gallium nitride (GaN) power stages that are used in power converter circuits. In some embodiments, the GaN power stage can include a variable drive driver circuit and a GaN power switch, where the variable drive driver circuit is arranged to provide a gate control voltage to the GaN power switch in order to change a conductivity state of the GaN power switch from OFF to ON state and vice versa. The variable drive driver circuit can be further arranged to provide an overdrive voltage to the gate of the GaN power switch.

In some embodiments, the variable drive driver circuit can sense operating state of the GaN power switch and provide a variable gate drive voltage to the gate GaN power switch according to the operating state of the GaN power switch. For example, when the driver circuit detects that the GaN power switch has entered a saturation mode of operation, the driver circuit can provide an overdrive gate drive voltage to the gate terminal of the GaN power switch in order to improve switching performance and saturation current capability of the GaN power switch. In various embodiments, the driver circuit is arranged to shut down the GaN power switch when the driver circuit determines that the saturation mode of operation of the GaN power switch is an actual fault condition. A GaN power switch operating in its saturation mode of operation may experience overheating that may cause damage to the GaN power switch. Further, a GaN power switch operating in its saturation mode of operation may have relatively high drain-to-source voltage while simultaneously have a relatively large fault current flowing through it. This can lead to relatively high power losses and reduce efficiency of the power converter.

The GaN power switch may have a maximum voltage rating (Vmax) on its gate terminal that indicates a safe operating area (SOA) for the GaN power switch. In a typical operation, the gate voltage of the GaN power switch is driven below the maximum voltage rating of the gate such that the GaN power switch can operate safely and reliably. GaN switches may be relatively more sensitive to voltage excursions as compared to silicon switches. Due to construct of GaN isolated gate high electron mobility transistor (HEMT) switches, the gate of a GaN switch may operate with relatively lower levels of absolute maximum rating as compared to their silicon counterparts.

Furthermore, operation of a GaN power switch at relatively high temperatures may degrade performance of the GaN power switch. At high temperature, a threshold voltage of the GaN power switch can increase substantially compared to room temperature. Further, a so-called miller plateau of the GaN power switch may increase at relatively high temperatures, therefore the level of miller plateau may be relatively close to the level of steady state gate operating voltage, thus a current that can be pushed into the gate of the GaN power switch may be relatively small, thus a switching speed of the GaN power switch may degrade substantially. Under such conditions, the GaN power switch may dissipate relatively high levels of power that can lead to overheating and damage to the GaN power switch. To address these issues, embodiments of the disclosure provide drive circuits and drive methods to provide additional gate voltage drive, thus ensuring sufficient gate current for a robust switching performance at high temperatures of operation.

For a GaN power switch, it is beneficial that a voltage on its gate terminal be controlled relatively accurately when overdriving the gate terminal because a relatively high overdrive voltage that is not controlled accurately may damage the gate of the GaN power switch. Embodiments of the disclosure enable overdriving the gate voltage of the GaN power switch while keeping the gate voltage accurately within a safe region of operation. Moreover, embodiments of the disclosure provide circuits and methods for driving the gate voltage of the GaN power switch beyond the maximum voltage rating for relatively short periods of time in order to increase current provided by the GaN power switch while at the same time ensuring safe and reliable operation of the GaN power switch. In some embodiments, a variable voltage driver circuit can increase the current in the GaN power switch substantially by increasing the gate driver voltage, for example, from 6 V to 9 V. Embodiments of the disclosure allow for a reduction of die size and system costs by enabling relatively high currents to be produced by the GaN power switch. In various embodiments, disclosed gate overdrive techniques can be useful in many applications and operating conditions such as, but not limited to, when a GaN power switch may be operating in its saturation mode of operation, or when the GaN power switch may be operating at a relatively high temperature that can degrade the performance of the GaN power switch such as its current drive capability and/or switching characteristics. Embodiments of the disclosure provide overdrive techniques that can improve the performance of a GaN power switch at relatively high temperatures of operation and/or improve its dynamic switching performance characteristics.

In some embodiments, the driver circuit can be arranged to provide a target voltage to the gate terminal of the GaN power switch. In this way, a custom gate drive can be applied to the gate terminal and accurately control the gate voltage of the GaN power switch. In various embodiments, the driver circuit is arranged to be a variable driver circuit where a voltage provided to the gate terminal of the GaN power switch can have same value as that of the power supply of the driver circuit, or it may be a fraction of the voltage of the power supply. For example, the driver circuit may receive an input voltage from a power supply and use an onboard low drop-out circuit to provide various values of voltages inside the driver circuit. These voltages may be used to customized voltages provided to the gate of the GaN power switch. In some embodiments, the driver circuit is arranged to provide a variable voltage of the power supply to the gate terminal of the GaN power switch. Embodiment of the disclosure can improve operational performance of a GaN switch under operating conditions such as, but not limited to, full load and over current by over driving gate voltage of a the GaN switch.

In various embodiments, circuits disclosed herein include a GaN switch having a gate terminal, a drain terminal and a source terminal, a driver circuit having an output terminal coupled to the gate terminal, where the driver circuit is arranged to generate an output voltage at the output terminal such that: the output voltage is at a first voltage when a voltage at the drain terminal is below a predetermined voltage; the output voltage is at a second voltage when 1) the voltage at the drain terminal is above the predetermined voltage and 2) a time period during which the output voltage is at the second voltage is less than a predetermined time; and where the second voltage is greater than the first voltage.

In some embodiments, systems disclosed herein include a GaN switch having a gate terminal, a drain terminal and a source terminal, a driver circuit coupled to the gate terminal and arranged to generate an output voltage at the gate terminal to control a conductivity state of the GaN switch, a first detector circuit coupled to the drain terminal and arranged to detect a drain terminal voltage and generate a first signal such that when the drain terminal voltage is less than a first predetermined voltage the first signal has a low state and when the drain terminal voltage is greater than the first predetermined voltage the first signal has a high state. The output voltage is set to a first voltage when the first signal has a low state and is set to a second voltage when the first signal has a high state.

In various embodiments, circuits and methods are disclosed for detecting a voltage at a drain terminal of the GaN power switch, as well as detecting a voltage at the gate terminal of the GaN power switch, where the drain and gate voltage information can be used by a variable drive driver circuit to customize the gate voltage provided to the gate terminal of the GaN power switch. In some embodiments, the driver circuit can be silicon-based or GaN-based. Various inventive embodiments are described herein, including methods, processes, systems, devices, and the like.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

FIG. 1 illustrates a variable voltage driver circuit, according to certain embodiments. The variable voltage driver circuit may also be referred to as a variable drive driver circuit or a driver circuit. As shown in FIG. 1, a variable voltage driver circuit 110 can have an output terminal 109 that can be coupled to a gate terminal 108 of a GaN power switch 102. A voltage at the output terminal 109 may be different than a voltage at the gate terminal 108 due to the presence of system parasitic elements, such as trace metal resistances or inductances. The GaN power switch 102 can also have a drain terminal 104 and a source terminal 106. The source terminal 106 may be connected to a power ground node 130. The variable voltage driver circuit 110 may include a drain voltage detector circuit 120 and a gate voltage detector circuit 122. The gate voltage detector circuit can be arranged to sense the gate voltage of the GaN power switch 102 and determine if the gate voltage is in high state or low state. The gate voltage is in high state when it is above a particular threshold voltage and is in low state when it is below the threshold voltage. A value of the particular threshold voltage may be, for example, 7 V. A sensing element 112 may be coupled between the drain terminal 104 and the variable voltage driver circuit 110. In some embodiments, the sensing element may be a diode. In various embodiments, the sensing element may be a depletion mode (D-mode) switch, such as, but not limited to, a high voltage D-mode GaN switch. The sensing element can be used to sense a voltage at the drain terminal 104.

A control and logic circuit 116 can be coupled to the variable voltage driver circuit 110. The control and logic circuit 116 can transmit various control signals to the variable voltage driver circuit. In some embodiments, the variable voltage driver circuit 110 may transmit drain voltage and gate voltage information to the control and logic circuit 116. The variable voltage driver circuit 110 can be coupled between a power supply 128 and a ground 131. In various embodiments, the variable voltage driver circuit 110 may be powered by a supply that is derived from the power supply 128 by, for example, a low drop-out circuit. In this way, the output drive voltage of the variable voltage driver circuit 110 can be changed by a user.

The variable voltage driver circuit 110 may be arranged to drive the gate voltage at the gate terminal 108 at normal operating voltages, for example, 6 V, and also drive the gate voltage at an overdrive voltage that is above the normal operating voltage, for example, at 8 V. In some embodiments, the variable voltage driver circuit 110 may include a terminal that allows the control and logic circuit 116, or a user, to set the level of the output drive voltage of the variable voltage driver circuit 110. The variable voltage driver circuit 110 can be arranged to keep a time duration of the overdrive voltage accurately for relatively short time periods, for example, 200 ns. By being able to provide overdrive voltage accurately for relatively short period time, the GaN power switch 102 can continue to operate safely and reliably while a substantially higher current can be generated by the GaN power switch during the overdrive time period.

The variable voltage driver circuit 110 can sense a voltage at the drain terminal 104 and also sense the gate voltage at the gate terminal 108. The variable voltage driver circuit 110 can use the sensed drain terminal voltage to determine whether the GaN power switch has entered its saturation mode of operation, or whether there is an actual surge condition present such a shoot through or an overcurrent condition. In some embodiments, the overdrive time period may be 0.1 ns to 1 us. In various embodiments, the overdrive time period may be 10 ns to 500 ns, while in other embodiments the overdrive time period may be 100 ns to 300 ns. As appreciated by one of ordinary skill in the art having the benefit of this disclosure, the overdrive time period can be set to any suitable value. An overcurrent condition may be defined as when a current through switch or a power switch exceeds a threshold. For example, an overcurrent may occur when a power switch is turned on without a current limiting element in the circuit. A full load operating condition may be defined as when the power switch carries its maximum rated current.

During a drive cycle, the variable voltage driver circuit 110 can start by providing a normal drive voltage to the gate terminal 108, for example, 6 V. The variable voltage driver circuit 110 monitors the drain terminal voltage. When the drain voltage exceeds a predefined threshold voltage (indicating a saturation condition), the variable voltage driver circuit 110 may increase the gate drive voltage above the normal operating voltage to an overdrive voltage, for example, 8 V. The variable voltage driver circuit 110 then waits for a predetermined time period, for example, 200 ns. If after the predetermined time period, the drain voltage drops below the predetermined threshold voltage, the gate drive voltage can be reduced to the normal drive voltage. In some embodiments, the gate drive voltage may be kept at the overdrive level for a relatively short time period and then reduced to the normal drive voltage. In various embodiments, the overdrive voltage may be 6.2 V to 12 V. In some embodiments, the overdrive voltage may be 6.5 V to 10 V, while in other embodiments the overdrive voltage may be 7 V to 9 V. As appreciated by one of ordinary skill in the art having the benefit of this disclosure, the overdrive voltage can be set to any suitable value.

If the drain voltage continues to stay above the predetermined threshold voltage after the predetermined time period, then a fault condition is declared and the drive voltage is reduced to zero, i.e., the GaN power switch 102 is shut down. The variable voltage driver circuit 110 is arranged to keep the overdrive time period to a relatively short time period. In this way, the gate of the GaN power switch does not experience the overdrive voltage for relatively long periods of time even with accumulation of cycles in overdrive mode and the GaN power switch can continue to function safely and reliably.

Figures 2A, 2B:
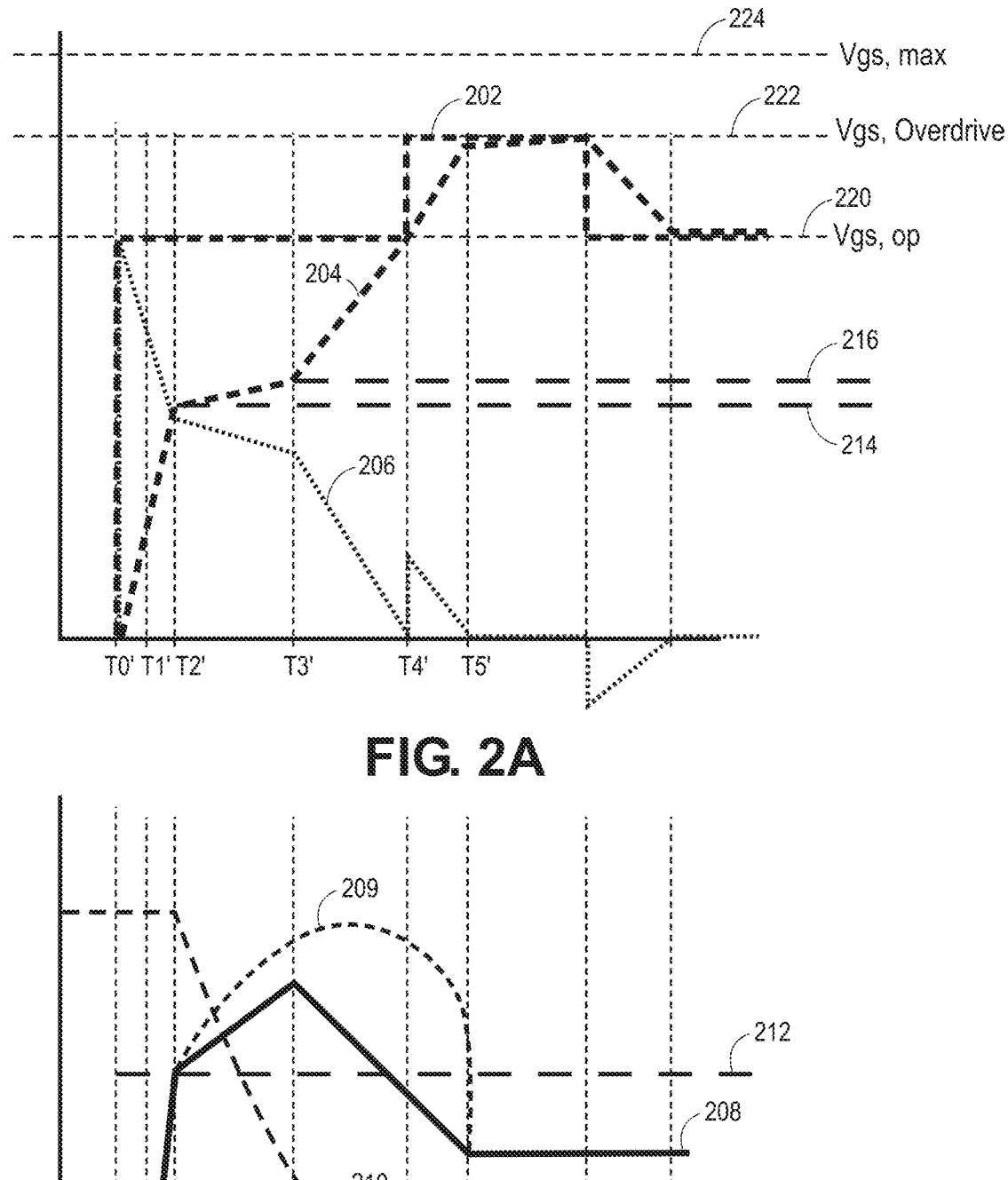
FIG. 2A and FIG. 2B illustrate timing diagrams showing drive voltage of the variable voltage driver circuit of FIG. 1, and various voltages and currents in a GaN power switch according to some embodiments.

FIG. 2A and FIG. 2B illustrate timing diagrams showing drive voltage of the variable voltage driver circuit 110, and various voltages and currents in the GaN power switch 102, according to some embodiments. The x-axis shows time, and the y-axis shows voltage and current. Graph 202 shows the drive voltage of the variable voltage driver circuit at output terminal 109 as a function of time. Graph 204 shows the gate voltage of the GaN power switch 102 at gate terminal 108 as a function of time. Graph 206 shows gate current of the GaN power switch 102 as a function of time. Graph 208 shows drain-to-source (Ids) of the GaN power switch as a function of time. Graph 209 shows drain-to-source (Ids) of the GaN power switch within a system that may have parasitic capacitances. Graph 210 shows the drain voltage of the GaN power switch at the drain terminal 104 as a function of time. FIG. 2A also shows an operating gate voltage Vgs,op 220, overdrive voltage Vgs,overdrive 222 and an absolute maximum voltage Vgs,max 224.

As shown in FIG. 2A, at time T0, the drive voltage of the variable voltage driver circuit at output terminal 109 may rise from zero to an operating gate voltage Vgs,op. Subsequent to the increase in the drive voltage, the gate voltage of the GaN power switch 102 at gate terminal 108 increases from zero to a first intermediate voltage 214 at time T2 at a relatively rapid rate. The drive voltage of the variable voltage driver circuit at output terminal 109 stays constant at the operating gate voltage Vgs,op until time T4. At time T4, if the variable voltage driver circuit 110 detects that the GaN power switch has entered its saturation mode of operation, then the variable voltage driver circuit 110 can increase the drive voltage at output terminal 109 to an overdrive voltage Vgs,overdrive. The variable voltage driver circuit 110 may be arranged to detect saturation condition continuously, for example, the variable voltage driver circuit 110 may check for saturation condition at other times as well, such as but not limited to, at time T2 and/or time T3. In some embodiments, the overdrive voltage Vgs,overdrive may be less than the absolute maximum voltage Vgs,max. The variable voltage driver circuit 110 can keep the drive voltage at the overdrive value for a predetermined time period, for example, 200 ns. Under come condition, saturation may indicate an actual fault condition such as over current and/or surge current condition.

If at the end of the predetermined time period, the GaN power switch is out of the saturation mode of operation, the drive voltage at output terminal 109 can be reduced to the operating gate voltage Vgs,op for a normal mode of operation. However, if at the end of the predetermined time period, the GaN power switch is still in the saturation mode of operation, a fault condition is declared and the drive voltage at output terminal 109 may be reduced to zero, i.e., the GaN power switch is shut down to prevent it from operating outside of its SOA and prevent it from getting damaged. A GaN power switch operating in its saturation mode of operation may experience overheating and get damaged. In some embodiments, even if the GaN power switch comes out of the saturation mode, the overdrive voltage at the gate may be maintained for the rest of the switching cycle period.

As shown in FIG. 2A, the gate voltage of the GaN power switch 102 at gate terminal 108 may increase from the first intermediate voltage to a second intermediate voltage 216 at time T3 at a relatively slow rate. The time between T2 and T3 where the gate voltage of the GaN power switch 102 levels may be referred to as the so-called miller plateau. The gate voltage of the GaN power switch 102 at gate terminal 108 increases from the second intermediate voltage to the operating gate voltage Vgs,op at time T4 at a relatively rapid rate. In some embodiments, a value for the operating gate voltage Vgs,op may be, for example, 6V. In various embodiments, the value for the operating gate voltage Vgs,op may be, 5 V to 7 V, while in other embodiments the operating gate voltage Vgs,op may be 3 V to 12 V. As appreciated by one of ordinary skill in the art having the benefit of this disclosure, the operating gate voltage Vgs,op can be set to any suitable value. In some embodiments, a value for the overdrive voltage Vgs,overdrive may be, for example, 8V. In various embodiments, the value for the overdrive voltage Vgs,overdrive may be 7 V to 9 V, while in other embodiments the value for the overdrive voltage Vgs,overdrive may be 8 V to 12 V. As appreciated by one of ordinary skill in the art having the benefit of this disclosure, the overdrive voltage Vgs,overdrive can be set to any suitable value. In certain embodiments, the variable voltage driver circuit 110 be configured to keep the drive voltage elevated at overdrive voltage Vgs,overdrive for an entire switching cycle, rather than drop it to operating gate voltage Vgs,op.

As shown in FIG. 2B, at time T0, the GaN power switch is OFF and the drain voltage at the drain terminal 104 is at a high state. In some embodiments, the high state value for the drain terminal voltage may be, for example, 400 V. In various embodiments, the high state value for the drain terminal voltage may be, 100 V to 800 V, while in other embodiments the high state value for the drain terminal voltage may be 5 V to 1200 V. As appreciated by one of ordinary skill in the art having the benefit of this disclosure, the high state value for the drain terminal voltage can be set to any suitable value. The drain voltage at the drain terminal 104 continues to stay at the high state until T2, and then reduces at a first rate of voltage with respect to time until time T3 and at a second rate of voltage with respect to time until time T4. The drain voltage at the drain terminal 104 then reduces at a third rate of voltage with respect time until time T5, when it reaches zero value. When the voltage at the drain terminal 104 is below a predetermined threshold voltage 212, the GaN power switch is out of the saturation mode of operation.

Graph 208 shows drain-to-source (Ids) of the GaN power switch as a function of time. At time T1, Ids increases from zero to a first current value. Ids continues to increase to a second current value at time T3. Subsequently, Ids reduces to a third current value to time T5.

A current drive capability of a GaN switch may degrade at relatively high temperature of operation. By overdriving the gate of the GaN power switch, the variable voltage driver circuit 110 can improve the performance of the GaN power switch during operation at relatively high temperatures. Further, the variable voltage driver circuit 110 can improve saturation current drive of the GaN power switch.

Figure 3A:
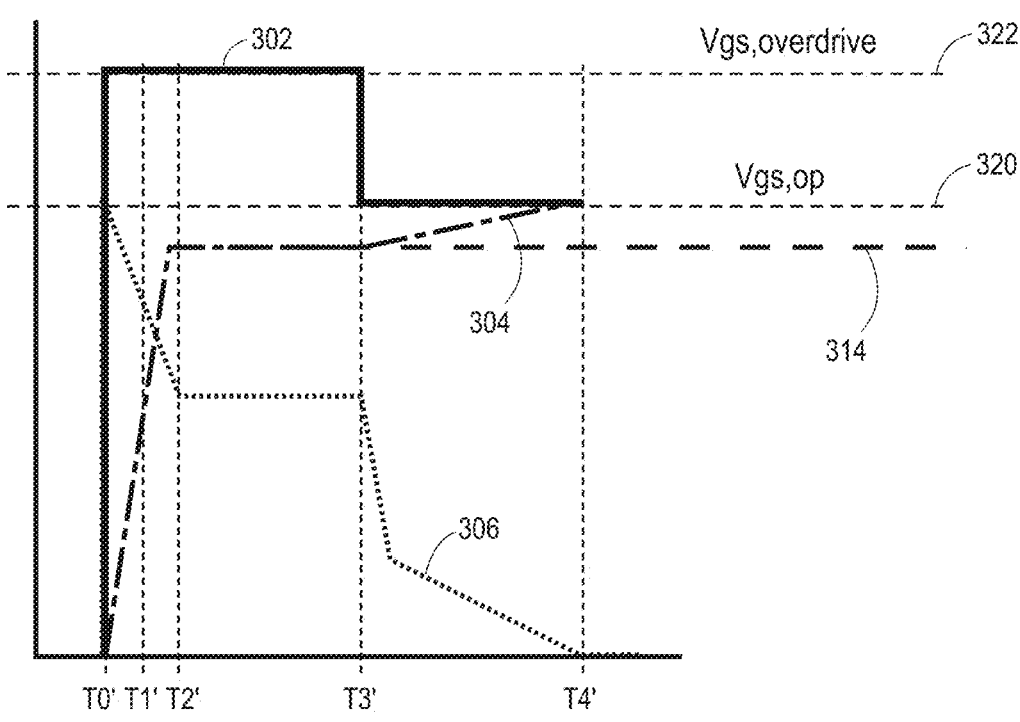
FIG. 3A and FIG. 3B illustrate timing diagrams showing drive voltage of the variable voltage driver circuit of FIG. 1, and various voltages and currents in a GaN power switch operating at relatively high temperature, according to some embodiments.
Figure 3B:
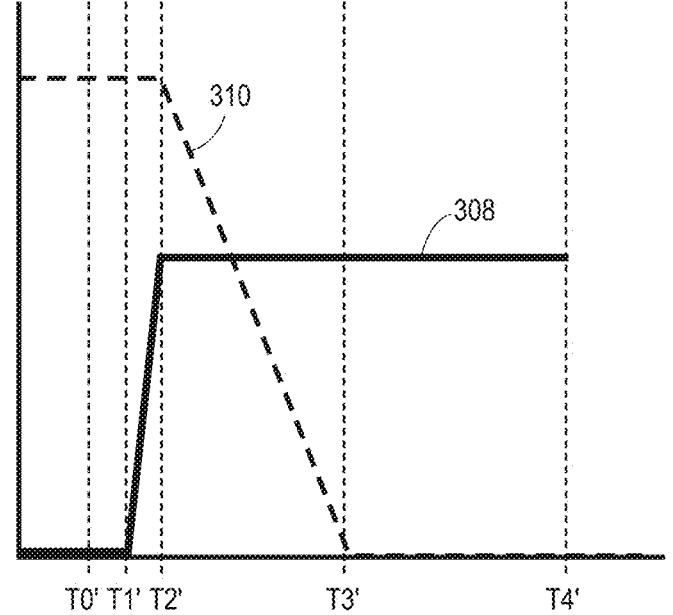

FIG. 3A and FIG. 3B illustrate timing diagrams showing drive voltage of the variable voltage driver circuit 110, and various voltages and currents in the GaN power switch 102 operating at relatively high temperature, according to some embodiments. The x-axis shows time and the y-axis shows voltage and current. Graph 302 shows the drive voltage of the output terminal 109 as a function of time. Graph 304 shows the gate voltage of the GaN power switch 102 at gate terminal 108 as a function of time. Graph 306 shows gate current of the GaN power switch 102 as a function of time. Graph 308 shows drain-to-source current (Ids) of the GaN power switch as a function of time. Graph 310 shows the drain voltage of the GaN power switch at the drain terminal 104 as a function of time. FIG. 3A also shows an operating gate voltage Vgs,op 320, and an overdrive voltage Vgs, overdrive 322.

In this embodiment, as shown in FIG. 3A, the variable voltage driver circuit 110 may start at time T0 by setting output to Vgs,overdrive. Subsequent to the increase in the drive voltage of the variable voltage driver circuit at output terminal 109, the gate voltage of the GaN power switch 102 at gate terminal 108 may increase from zero to a first intermediate voltage 314 at time T2 at a relatively rapid rate. However, the level of miller plateau may be increased at high temperature of operation compared to room temperature operation, therefore the level of miller plateau may be relatively close to the level of Vgs,op, i.e., the difference between the steady state operating gate voltage Vgs,op and the miller plateau at high temperature may be relatively small. Therefore, without an overdrive, the current that can be pushed into the gate of the GaN power switch may be relatively small and so the switching speed of the GaN power switch may be relatively slow. Under such conditions, the GaN power switch may dissipate relatively high level of power that can lead to overheating and damage to the GaN power switch.

For example, performance characteristics of a GaN power switch may degrade from a typical room temperature operation at 25° C. to high temperature operation above 100° C., such as at 150° C. Another issue that a GaN power switch may experience at high temperature of operation is an increase in its threshold voltage. To address these issues, the variable voltage driver circuit 110 can be arranged to provide additional gate voltage drive, thus ensuring sufficient gate current for a robust switching performance at high temperatures of operation. It is advantageous to have a relatively high gate current such that the drain terminal voltage can decrease at a relatively rapid rate. The faster the drain voltage decreases the less energy may be dissipated during switching. The variable voltage driver circuit 110 can be arranged to provide additional gate voltage drive at room temperature without affecting the reliability of the GaN power switch. Once the drain voltage is detected as being low at time T3, the variable voltage driver circuit 110 can reduce the output drive voltage to the steady state target voltage value of Vgs,op. Furthermore, at time T3, the gate current may drop to a relatively low value when the gate drive is back to its steady state value. The gate drive voltage is at its steady state value at time T4. This can be repeated for every switching cycle.

The disclosed variable voltage driver circuit 110 and the related drive techniques can be advantageous when integrating GaN power switches with drive circuits in a unitary semiconductor package because they can allow for relatively high operational switching frequencies, since the traces between the drive circuit and the GaN power switch can be relatively short in a unitary semiconductor package. Operation at relatively high frequencies can enable a reduction in size of system passive components such as inductors and capacitors, and thus enable a reduction in system size. As an example, a time delay for detecting the drain terminal voltage being at low state and the subsequent reduction of the gate overdrive at T3 may be, 2 to 4 ns, however other time delays may be used. In some embodiments, the disclosed circuits and methods can also be used in systems that use discrete GaN power switches along with discrete driver circuits.

Figure 4A:
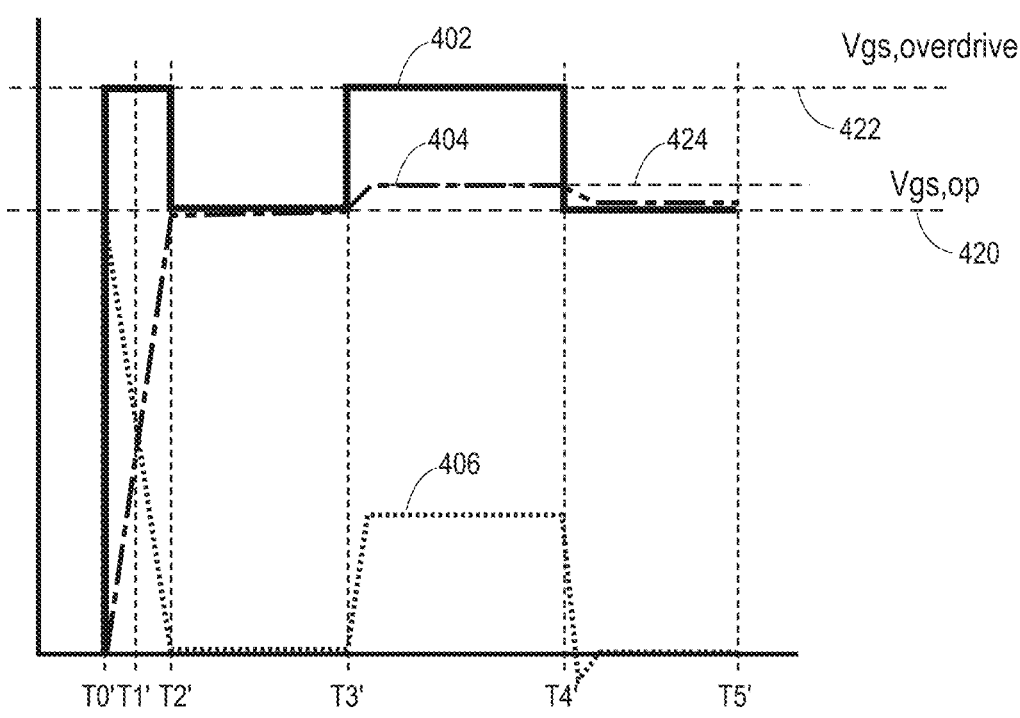
FIG. 4A and FIG. 4B illustrate timing diagrams showing drive voltage of the variable voltage driver circuit of FIG. 1, and various voltages and currents in a GaN power switch when a saturation current condition occurs, according to some embodiments.
Figure 4B:
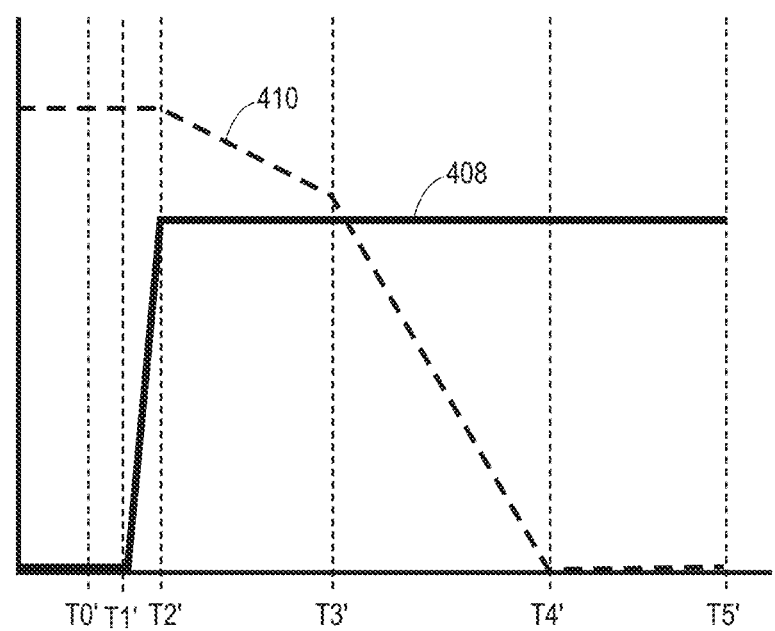

FIG. 4A and FIG. 4B illustrate timing diagrams showing drive voltage of the variable voltage driver circuit 110, and various voltages and currents in the GaN power switch 102 when a saturation current condition occurs, according to some embodiments. The x-axis shows time, and the y-axis indicates voltage and current. Graph 402 shows the drive voltage of the variable voltage driver circuit 110 at output terminal 109 as a function of time. Graph 404 shows the gate voltage of the GaN power switch 102 at gate terminal 108 as a function of time. Graph 406 shows gate current of the GaN power switch 102 as a function of time. Graph 408 shows drain-to-source current (Ids) of the GaN power switch as a function of time. Graph 410 shows the drain voltage of the GaN power switch at the drain terminal 104 as a function of time. FIG. 4A also shows an operating gate voltage Vgs,op 420, and an overdrive voltage Vgs,overdrive 422.

As shown in FIG. 4A, the start of the graphs looks similar to the graph in FIG. 3A. The variable voltage driver circuit 110 provides an overdrive to the gate terminal of the GaN power switch 102. However, as shown in FIG. 4B, the drain-to-source current (Ids) to be switched is relatively higher compared to the Ids in FIG. 3B. As the Ids in FIG. 4B may be close to the saturation current of the GaN power switch 102, the gate voltage may increase to a relatively high level because the flow of drain-to-source current occurs before the drain terminal can start moving down. As shown in FIG. 4A, at time T2 the gate voltage may reach a value of operating gate voltage Vgs,op, however the drain voltage may still be in a high state. This can indicate a fault condition. Therefore, the variable voltage driver circuit 110 can stop overdriving at time T2 to prevent damage to the GaN power switch. In this situation, the gate voltage may stay at the steady state operating gate voltage Vgs,op from times T2 to T3. This gate drive value may not be sufficient to bring the drain terminal voltage to a low state. The drain terminal voltage may not move down at a relatively fast rate.

The variable voltage driver circuit 110 can be arranged to start a system fault timer at time T2 because the drain terminal voltage is at a high level at time T2. At time T3 the system fault timer may elapse. At this point, the variable voltage driver circuit 110 may determine two possible paths to proceed. The first is that the system is relatively close to the saturation limit so the variable voltage driver circuit 110 may not declare a fault because the system is close to the saturation limit but it is not in a fault condition. Thus, the variable voltage driver circuit 110 may overdrive at time T3 and increase the gate voltage to overdrive voltage Vgs, overdrive 422, and start another timer (saturation current boost timer) at time T3. The gate voltage may increase by a relatively small amount and reach a miller plateau at 424. Since the miller plateau 424 is above the operating gate voltage Vgs,op, the gate current may increase again. The drain voltage does down, and at time T4 reaches a low value. At this point, the variable voltage driver circuit 110 may stop overdriving the gate at time T4 and the gate voltage reduces to the operating gate voltage Vgs,op.

At time T4 another timer is started because at time T3 the saturation current boost timer was started that expires at time T5. At time T5, the variable voltage driver circuit 110 can check the drain voltage to see if the drain voltage is still low. If the drain voltage is low, there is no fault. The variable voltage driver circuit 110 can continue normal operation until the PWM signal comes in and signals it to turn off the GaN power switch 102.

In the event that the variable voltage driver circuit 110 stops overdriving, and the drain terminal goes high again at time T5, then a either fault condition is declared or the variable voltage driver circuit 110 can attempt N number of times to overdrive the gate to see if the fault condition goes away. The control and logic circuit 116 or a user may configure the variable voltage driver circuit 110 to attempt to overdrive for N number of times. If after N+1 attempts at time T5 there still is a fault condition, a fault condition is declared and the GaN power switch can be shut down. In this way, a GaN power switch can be operated close to its safe area of operation and improve switching characteristics. This method can be advantageous for driving GaN power switches because it can improve the ability to switch into high currents that are relatively close to the limit of the GaN power switch, which can be a limitation for GaN switches compared to silicon switches. In some embodiments, the variable voltage driver circuit 110 can be configured to chose to keep the driver output elevated to overdrive voltage Vgs,overdrive for the entire switching cycle, rather than drop it to operating gate voltage Vgs,op at time T4.

Figure 5:
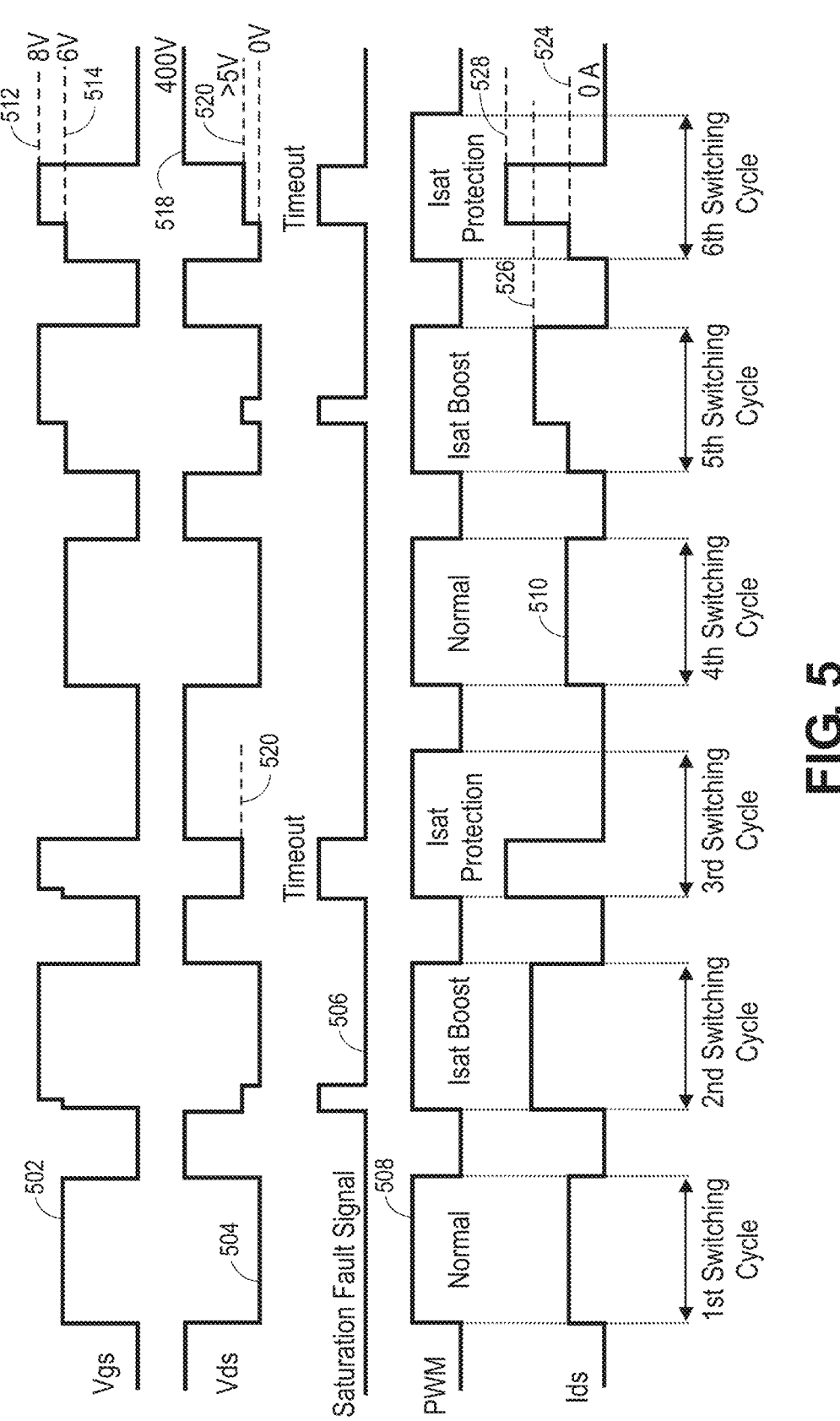
FIG. 5 illustrates timing diagrams showing drive voltage of the variable voltage driver circuit of FIG. 1, and various voltages and currents in a GaN power switch for several switching cycles, according to some embodiments.

FIG. 5 illustrates timing diagrams showing drive voltage of the variable voltage driver circuit 110, and various voltages and currents in the GaN power switch 102 for several switching cycles, according to some embodiments. The x-axis shows time, and the y-axis indicates voltage and current. Graph 502 shows the gate to source voltage (Vgs) of the GaN power switch as a function of time. Graph 504 shows the drain voltage of the GaN power switch as a function of time. Graph 506 shows saturation fault signal as a function of time. Graph 508 shows a pulse width modulation (PWM) as a function of time. Graph 510 shows the drain-to-source current of the GaN power switch as a function of time. Graph 502 shows various Vgs levels including an operating Vgs,op 514, and an overdrive Vgs, overdrive level 512. Graph 504 shows various drain voltage levels including an operating drain voltage 518 and an intermediate voltage 520. Graph 510 shows various Ids current levels including a normal operating current 524, a surge load current level 526 and an over current level 528.

In the first switching cycle, a normal switching cycle transpires. When the PWM signal goes high, Vgs goes high to the operating Vgs,op 514 level, for example, 6 V and stays high for the duration of PWM. The GaN power switch turns on where the Ids goes high, while the drain voltage drops down to zero and stays low for the duration of PWM.

In the second switching cycle, an Isat boost switching cycle transpires. During the second switching cycle, Vgs goes high to the operating Vgs,op 514 level, however the drain voltage does not drop all the way down to zero, instead it goes down to an intermediate voltage 520, for example, a voltage that is larger than 5 V. A saturation fault signal is generated. The variable voltage driver circuit 110 increases the drive voltage to the overdrive the GaN power switch such that the Vgs of the GaN power switch increases to Vgs,overdrive level 512, for example, 8V. As a result, the drain-to-source current Ids goes to the surge load current level 526. After the overdrive period, the Vds drops down to zero. The gate-to-source voltage Vgs can continue to stay at the overdrive Vgs,overdrive level 512 for the time period of the second switching cycle. In some embodiments, after the drain voltage drops down to zero, variable voltage driver circuit 110 may bring down Vgs to the operating Vgs,op 514 level.

In the third switching cycle, an Isat protection switching cycle transpires. During the third switching cycle, Vgs goes increases to operating Vgs,op 514 level however Vds does not go down to zero. The variable voltage driver circuit 110 increases the drive voltage such that Vgs increases to Vgs,overdrive level 512 however Vds still does not go down to zero. The GaN power switch is saturated because even with the boosted (overdriven) Vgs, the drain voltage does not go to zero. The variable voltage driver circuit 110 started an Isat boost timer when the gate overdrive is started. After the Isat boost timer expires, for example, after 200 ns, the variable voltage driver circuit 110 detects that Vds is still not at zero volt, therefore a fault condition is declared. The saturation fault signal indicates that the gate of the GaN power switch can be shut down even when the PWM signal is high. In this way, the GaN power switch is protected such that it does not overheat and get damaged.

In the fourth switching cycle, a normal switching cycle transpires. In the fifth switching cycle an Isat boost switching cycle transpires similar to the second switching cycle, however in the fifth switching cycle the overdrive occurs during the switching period. The drain voltage may high during the switching period. The variable voltage driver circuit 110 increases the drive voltage such that Vgs increases to Vgs,overdrive level 512. As a result, the drain voltage drops to zero, and not fault condition is declared.

In the sixth switching cycle, an Isat protection switching cycle transpires similar to the third switching cycle, however in the sixth switching cycle the drain voltage increases mid-cycle during the switching period. The variable voltage driver circuit 110 overdrives the gate voltage, however the drain voltage still does not go down to zero, therefore a fault condition is declared and the gate is shut down to protect the GaN power switch.

FIG. 6 is a simplified flowchart illustrating a method 600 of overdriving a gate of GaN power switch according to embodiments of the disclosure. As illustrated in FIG. 6, the method of overdriving a gate of GaN power switch includes turning on the GaN power switch (610). The method also includes waiting for a predetermined delay time period, such as, 50 to 100 ns. In some embodiments the predetermined delay time period can be 0.1 to 900 ns, while in other embodiments the predetermined delay time period can be 10 to 200 ns. The method also includes comparing drain voltage of the GaN power switch to a drain threshold voltage (620). The method further includes determining if the drain voltage is greater than the drain threshold voltage (630). Additionally, the method includes providing an overdrive voltage to the gate of the GaN power switch if the drain voltage is greater than the drain threshold voltage (640). If the drain voltage is not greater than the drain threshold voltage, a normal gate drive is provided to the gate (650). The method further includes determining if the drain voltage is still greater than the drain threshold voltage after a timer expired (660). Further, the method includes shutting down the GaN power switch if drain voltage is still greater than the drain threshold voltage after the timer expired (670). If the drain voltage is not greater than the drain threshold voltage, the overdrive voltage can be continued until the next switching cycle (680). In some embodiments, if the drain voltage is not greater than the drain threshold voltage, the overdrive voltage may be discontinued, and a normal drive voltage can be provided to the gate.

It should be appreciated that the specific steps illustrated in FIG. 6 provide a particular method of overdriving a gate of GaN power switch according to an embodiment of the disclosure. Other sequences of steps may also be performed according to alternative embodiments. For example, alternative embodiments of the disclosure may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7:
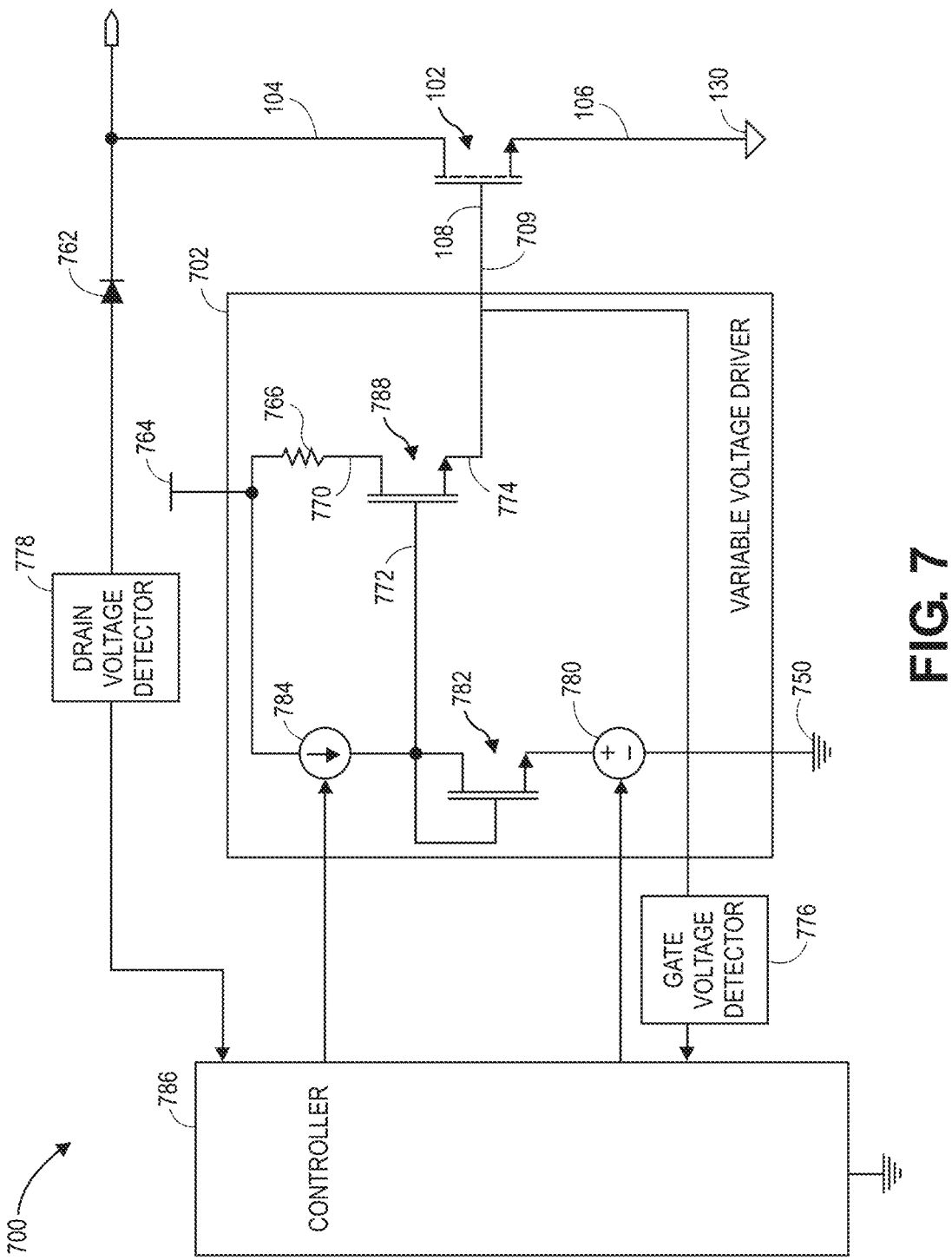
FIG. 7 illustrates a variable voltage driver circuit, according to certain embodiments.

FIG. 7 illustrates a variable voltage driver circuit 702 used in a power converter circuit 700, according to certain embodiments. As shown in FIG. 7, a variable voltage driver circuit 702 can be coupled to a gate terminal 108 of a GaN power switch 102. The GaN power switch 102 can also have a drain terminal 104 and a source terminal 106. The source terminal may be connected to a power ground node 130. The variable voltage driver circuit 702 can be coupled between a power supply 764 and a ground 750. The variable voltage driver circuit 702 can have an output terminal 709. A voltage at the output terminal 709 may be different than a voltage at the gate terminal 108 due to the presence of system parasitic elements, such as trace metal resistances or inductances. The variable voltage driver circuit 702 can also be coupled to a controller circuit 786. A drain voltage detector 778 can be coupled to a sensing element 762, where sensing element may be coupled to the drain terminal 104. the sensing element may be a diode. In various embodiments, the sensing element may be a depletion mode (D-mode) switch, such as, but not limited to, a high voltage D-mode GaN switch. The drain voltage detector 778 may be coupled to the controller. A gate voltage detector 776 may be coupled to the gate terminal 108 via the variable voltage driver circuit 702. In some embodiments, the variable voltage driver circuit 702 may include the drain voltage detector 778 and/or the gate voltage detector 776.

The variable voltage driver circuit 702 can include an impedance element 766 that is coupled between the power supply 764 and a switch 768. The switch 768 can have a drain terminal 770, a source terminal 774 and a gate terminal 772. The source terminal may be coupled to the output terminal 109. The variable voltage driver circuit 702 can also include a current source 784 that is coupled to a switch 782. The current source may also be coupled to the gate terminal 772. In some embodiments, the switch 782 may be configured in a diode-connected arrangement. The switch 782 may be coupled to a voltage source 780. The voltage source 780 can be arranged to set a target voltage for the gate drive output voltage at output terminal 109. The current source 784 and/or the voltage source 780 may be controlled by the controller circuit 786.

The variable voltage driver circuit 702 may be arranged to drive the gate voltage at the gate terminal 108 at normal operating voltages, for example, 6 V, and also overdrive the gate voltage above the normal operating voltages, for example, 8 V. In some embodiments, the variable voltage driver circuit 702 may include a terminal that allows the controller circuit 786 or a user to set the level of the output drive voltage of the variable voltage driver circuit. The variable voltage driver circuit 702 can be arranged to keep a time duration of the overdrive voltage accurately for relatively short time periods, for example, 200 ns. In this way, the GaN power switch 102 can continue to operate safely and reliably while a substantially higher current can be provided by the GaN power switch during the overdrive time period. The variable voltage driver circuit 702 can sense a voltage at the drain terminal 104 and also sense the gate voltage at the gate terminal 108. The variable voltage driver circuit 702 can use the sensed drain terminal voltage to determine whether the GaN power switch has entered its saturation mode of operation, or whether there is an actual surge condition occurring such a shoot through or an over-current condition.

The voltage source 780 can set a target voltage for the output voltage of the variable voltage driver circuit 702. The current source can provide proper biasing for switch 782. Switch 782 can provide a drive for the gate of the switch 768. In this way, switch 768 can be controlled to generate an output voltage at the output terminal 109 based on the controller commands. The variable voltage driver circuit 702 can be configured to work with the controller circuit 786 to execute the method 600 to overdrive the GaN power switch 102. The variable voltage driver circuit 702 can also configured to execute variations of method 600 in order to overdrive the GaN power switch 102.

In some embodiments, the variable voltage driver circuit 702 may include a sensor to detect an operating temperature of the GaN power switch 102. The variable voltage driver circuit 702 can use the operating temperature of the GaN power switch 102 to overdrive the GaN power when a relatively high operating temperature is detected. In some embodiments, the variable voltage driver circuit 702 may include a sensor to detect an operating current of the GaN power switch 102. The variable voltage driver circuit 702 can use the operating current of the GaN power switch 102 to overdrive the GaN power when a relatively high operating current is detected. In various embodiments, the variable voltage driver circuit 702 may include a first detector device coupled to the GaN switch and arranged to detect a drain terminal current and generate a first signal such that when the drain terminal current is less than a first predetermined current the first signal has a low state and when the drain terminal current is greater than the first predetermined current the first signal has a high state. The output voltage may be set to a first voltage when the first signal has a low state and is set to a second voltage when the first signal has a high state.

In some embodiments, combination of the circuits and methods disclosed herein can be utilized to provide variable gate drive for GaN power switches including providing gate overdrive to GaN power switches. Although circuits and methods are described and illustrated herein with respect to several particular configuration of variable gate driving and/or overdriving GaN power switches, embodiments of the disclosure are suitable for variable gate driving and/or overdriving other semiconductor power switches, such as silicon power switches or silicon carbide power switches.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. A circuit comprising:
a gallium nitride (GaN) switch having a gate terminal, a drain terminal and a source terminal; and
a driver circuit having an output terminal coupled to the gate terminal, wherein the driver circuit is arranged to generate an output voltage at the output terminal such that:
the output voltage is set to a first voltage when a voltage at the drain terminal is below a predetermined voltage;
the output voltage is set to a second voltage when the voltage at the drain terminal is above the predetermined voltage; and
wherein the second voltage is greater than the first voltage.

2. The circuit of claim 1, wherein the driver circuit is further arranged to generate the output voltage at the output terminal such that the output voltage is at the second voltage a for a predetermined time.

3. The circuit of claim 2, wherein when the voltage at the drain terminal is above the predetermined voltage after the predetermined time, the driver circuit generates zero voltage at the output terminal.

4. The circuit of claim 2, wherein the predetermined time is fixed.

5. The circuit of claim 1, wherein the driver circuit comprises a first detector circuit arranged to detect a voltage at the drain terminal.

6. The circuit of claim 5, wherein the driver circuit further comprises a second detector circuit arranged to detect a gate terminal voltage.

7. The circuit of claim 6, wherein the predetermined voltage is a first predetermined voltage, and wherein the driver circuit further comprises a comparator arranged to compare the detected gate terminal voltage to a second predetermined voltage.

8. A circuit comprising:
a gallium nitride (GaN) switch having a gate terminal, a drain terminal and a source terminal;
a driver circuit having an output terminal coupled to the gate terminal, wherein the driver circuit is arranged to generate an output voltage at the output terminal such that:
the output voltage is at a first voltage when a voltage at the drain terminal is below a predetermined voltage;
the output voltage is at a second voltage when 1) the voltage at the drain terminal is above the predetermined voltage and 2) a time period during which the output voltage is at the second voltage is less than a predetermined time; and
wherein the second voltage is greater than the first voltage.

9. The circuit of claim 8, wherein the predetermined time is fixed.

10. The circuit of claim 9, wherein when the voltage at the drain terminal is above the predetermined voltage after the predetermined time, the driver circuit generates zero voltage at the output terminal.

11. The circuit of claim 9, wherein the predetermined time is 200 nano seconds.

12. The circuit of claim 8, wherein the driver circuit comprises a first detector circuit arranged to detect a voltage at the drain terminal.

13. The circuit of claim 12, wherein the driver circuit comprises a second detector circuit arranged to detect a gate terminal voltage.

14. The circuit of claim 13, wherein the predetermined voltage is a first predetermined voltage, and wherein the driver circuit further comprises a comparator arranged to compare the detected gate terminal voltage of a second predetermined voltage.

15. A system comprising:

a gallium nitride (GaN) switch having a gate terminal, a drain terminal and a source terminal;

a driver circuit coupled to the gate terminal and arranged to generate an output voltage at the gate terminal to control a conductivity state of the GaN switch;

a first detector device coupled to the GaN switch and arranged to detect a drain terminal current and generate a first signal such that when the drain terminal current is less than a first predetermined current the first signal has a low state and when the drain terminal current is greater than the first predetermined current the first signal has a high state; and wherein the output voltage is set to a first voltage when the first signal has a low state and is set to a second voltage when the first signal has a high state.

16. The system of claim 15, further comprising a controller arranged to receive the first signal and in response transmit a second signal to the driver circuit.

17. The system of claim 16, further comprising a second detector device coupled to the gate terminal and arranged to detect a gate terminal voltage.

18. The system of claim 17, wherein the second detector device is arranged to generate a third signal such that when the gate terminal voltage is less than a second predetermined voltage the third signal has a low state and when the gate terminal voltage is greater than the second predetermined voltage the third signal has a high state.

19. The system of claim 18, wherein the controller is arranged to receive the third signal and in response to receiving the third signal transmit a fourth signal to the driver circuit.

20. The system of claim 19, wherein the driver circuit is arranged to receive the second and fourth signals and in response to receiving the second and fourth signals, generate the output voltage such that the GaN switch operates in its safe operating area (SOA).

* * * * *